(12) United States Patent
Boensch et al.

(10) Patent No.: US 7,648,371 B2
(45) Date of Patent: Jan. 19, 2010

(54) ELECTRICAL CONNECTOR ARRANGEMENT FOR KNIFE CONTACTS

(75) Inventors: Matthias Boensch, Bielefeld (DE); Thorsten Beck, Bad Arolsen-Wetterburg (DE); Klaus Pueschner, Detmold (DE); Klaus Holterhoff, Olpe (DE); Jim Cahaly, West Newbury, MA (US)

(73) Assignee: Weidmuller Interface GmbH & Co. KG, Detmold (DE)

( * ) Notice: Subject to any disclaimer, the term of this patent is extended or adjusted under 35 U.S.C. 154(b) by 0 days.

(21) Appl. No.: 12/080,405

(22) Filed: Apr. 2, 2008

(65) Prior Publication Data

US 2008/0248681 A1    Oct. 9, 2008

(30) Foreign Application Priority Data

Apr. 4, 2007    (DE) .................. 20 2007 005 126 U (51) Int. Cl.
*H01R 12/00*    (2006.01)
(52) U.S. Cl. ....................................... 439/76.1
(58) Field of Classification Search ................. 439/404, 439/535, 487, 76.1, 709, 374, 378, 567; 361/641
See application file for complete search history.

(56) References Cited

U.S. PATENT DOCUMENTS

| | | | |
|---|---|---|---|
| 4,310,211 A * | 1/1982 | Bunnell et al. ............... | 439/358 |
| 4,460,232 A | 7/1984 | Sotolongo | |
| 6,132,247 A * | 10/2000 | Liou et al. .................. | 439/567 |
| 6,344,612 B1 * | 2/2002 | Kuwahara et al. ............. | 174/50 |
| 7,097,516 B2 * | 8/2006 | Werner et al. ............... | 439/709 |
| 7,134,883 B2 * | 11/2006 | Werner et al. .............. | 439/76.1 |
| 7,291,036 B1 * | 11/2007 | Daily et al. ................. | 439/487 |

FOREIGN PATENT DOCUMENTS

| DE | 203 11 183 U1 | 8/2004 |
|---|---|---|
| DE | 20 2005 018 884 U1 | 3/2006 |
| WO | WO 2007/118798 A2 | 10/2007 |

* cited by examiner

*Primary Examiner*—Chandrika Prasad
(74) *Attorney, Agent, or Firm*—Lawrence E. Laubscher, Sr.; Lawrence E. Laubscher, Jr.

(57) ABSTRACT

An electrical connecting arrangement includes a locator device mounted on a photovoltaic panel for relatively positioning a connector housing such that a resilient contact on the connector housing is arranged for electrical connection with a stationary rigid contact on the photovoltaic panel that extends in space relation within a chamber contained in the locator device, connection being made via an access opening contained in the locator device. Preferably, the stationary contact is a knife contact having a rectangular configuration defining a pair of parallel end edges that are supported by a pair of support slots defined in the opposed walls of the access opening, thereby to support the stationary contact during the engagement thereof by the resilient contact.

15 Claims, 8 Drawing Sheets

ELECTRICAL CONNECTOR ARRANGEMENT FOR KNIFE CONTACTS

REFERENCE TO RELATED APPLICATION

This application is a companion application to the Boensch et al application Ser. No. 12/287,298 filed Oct. 8, 2008.

BACKGROUND OF THE INVENTION

1. Field of the Invention

An electrical connecting arrangement includes a locator device mounted on a photovoltaic panel for relatively positioning a connector housing such that a resilient contact on the connector housing is arranged for electrical connection with a stationary rigid contact on the photovoltaic panel that extends in space relation within a chamber contained in the locator device, connection being made via an access opening contained in the locator device.

2. Description of Related Art

The present invention relates to a connection device for conductive contacts at photovoltaic panels.

Current-generating photovoltaic systems generally have at least one photovoltaic panel to generate electricity from sunlight. As a rule, flexible, easily bending ribbon conductors are led out from the photovoltaic panels, making it possible to connect the photovoltaic panels—usually via a multiconductor cable—to a household installation, for example, or to electrical apparatus, such as an inverter or the like.

In the prior art, the individual flexible ribbon conductors are hooked up by hand using individual terminals or the like. For this reason, the connection process of the apparatus is relatively laborious and it is generally necessary to employ specially trained technicians to hook up the apparatus.

In addition, there is the problem that such installations are generally rather complicated and therefore can only be repaired with difficulty in event of a fault.

Connection devices are also known in which the ends of the conductors are connected with spring contacts (DE 20 2005 018 884 U1). Similar connection devices are shown in the U.S. patent to Sotolongo U.S. Pat. No. 4,460,232 and the German patent No. DE 203 11 183 U1.

Against this background, the problem of the invention is to realize a connection device or connection mechanism for contacts at photovoltaic panels, with which one can realize a contacting of the contacts and a connecting of them to another device or system in an easy and also long-lasting manner.

SUMMARY OF THE INVENTION

Accordingly, a primary object of the present invention is to provide locator means for positioning a connector housing relative to a photovoltaic panel, whereby a resilient contact on the connector housing is positioned opposite a stationary rigid contact on the panel, so that when the components are displaced together, the resilient contact is brought into electrical engagement with the stationary contact via an access opening contained in the locator means.

According to a more specific object of the invention, the aforementioned stationary contact preferably comprises a generally rectangular knife contact having end edge portions that are supported in slots or grooves contained in the opposed walls of the access opening, thereby to support the stationary contact during connection of the components.

A further object of the invention is to provide locator means in the form of a locator member that is fastened to the photovoltaic panel in protective enclosing relation about the stationary contact that extends orthogonally upwardly from the panel, said locator member having an upper surface carrying a locator pin that extends upwardly into a corresponding opening contained in the bottom of the connector housing that carries the resilient contact. The resilient contact extends through the access opening contained in the top surface of the locator member for connection with the stationary knife contact.

The invention creates a connection device for the particularly inflexible or substantially inflexible conducting contacts, especially for inflexible knife blade contacts, at a photovoltaic panel, from which at least one of the contacts, especially knife blade contacts, protrudes, and which has a holder that can be mounted, in particular, glued onto the photovoltaic panel to hold at least one contact, especially a knife blade contact, and a connection housing that can be placed on top of the holder.

The invention creates a connection device and replaces the conventional flexible contacts with firm, rigid contacts of at least substantially or totally inflexible design.

First of all, the invention abandons the idea of using flexible ribbon conductors for the contacting of photovoltaic panels. Instead, it uses inflexible contacts, especially knife blade contacts for the contacting (e.g., with spring contacts, which can then be designed with high spring and contact force), which simplifies the hooking up of the connection device.

Thus, the inflexible, firm contacts, especially knife blade contacts, are preferably secured with a circuit board as a subassembly on the photovoltaic panel and then the holder is secured on the photovoltaic panel, so that a preassembled unit is produced, which is especially firm and can more easily make contact as a preassembled unit than the known solutions of the prior art.

Preferably, the through opening(s) at least in their marginal region are of slot-like configuration, so that the knife blade contacts are easily held securely in the slot regions. Preferably, the holder member for the knife blade contact has a frame or inverted dish-like construction.

BRIEF DESCRIPTION OF THE DRAWINGS

Other objects and advantages of the invention will become apparent from a study of the following specification, when viewed in the light of the accompanying drawing, in which.

DETAILED DESCRIPTION OF THE INVENTION

Figure 1:
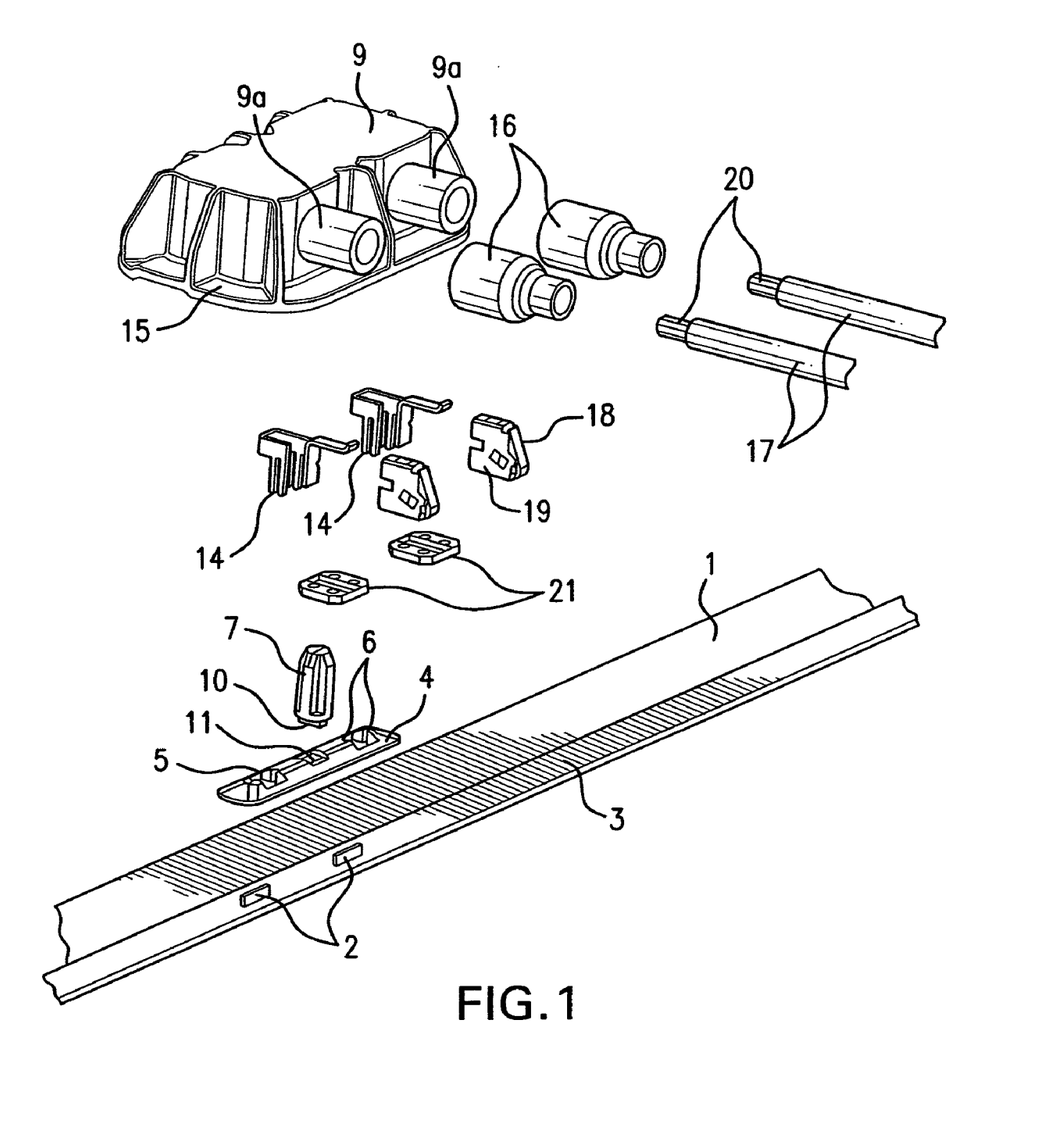
FIG. 1 is an exploded view of a first embodiment of the connector arrangement of the present invention.
Figure 2:
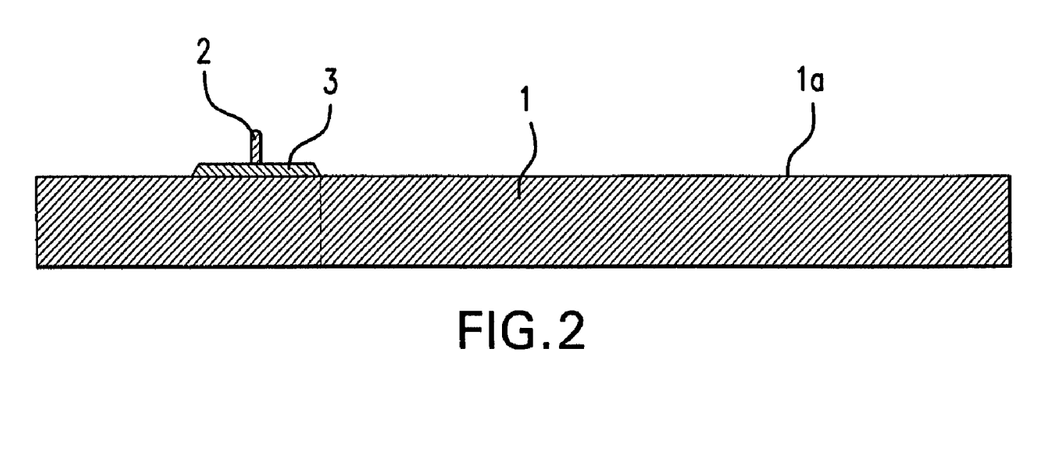
FIG. 2 is a sectional view of the photovoltaic panel.

Referring first more particularly to FIGS. 1 and 2, the connector assembly of the present invention serves to connect a pair of insulated electrical conductors 17 to a pair of stationary rigid integral knife contacts 2 that extend orthogonally upwardly from a conductive strip 3 that is laminated or deposited upon, and is in electrical engagement with, the upper surface 1$a$ of a photovoltaic panel 1. A rectangular mounting member 4 having a generally inverted dish-shaped configuration is adhesively fastened to the conductive strip in protective relation about the stationary contacts 2, whereby the contacts extend in spaced relation within the chamber defined within the mounting member. The mounting member 4 has a horizontal upper surface 4$a$ that contains access openings 5 above the stationary contacts 2, respectively. The stationary knife contacts 2 are generally rectangular and include vertical end surfaces that are supported in corresponding vertical support slots 6 contained in opposed walls of the access openings.

Figure 3:
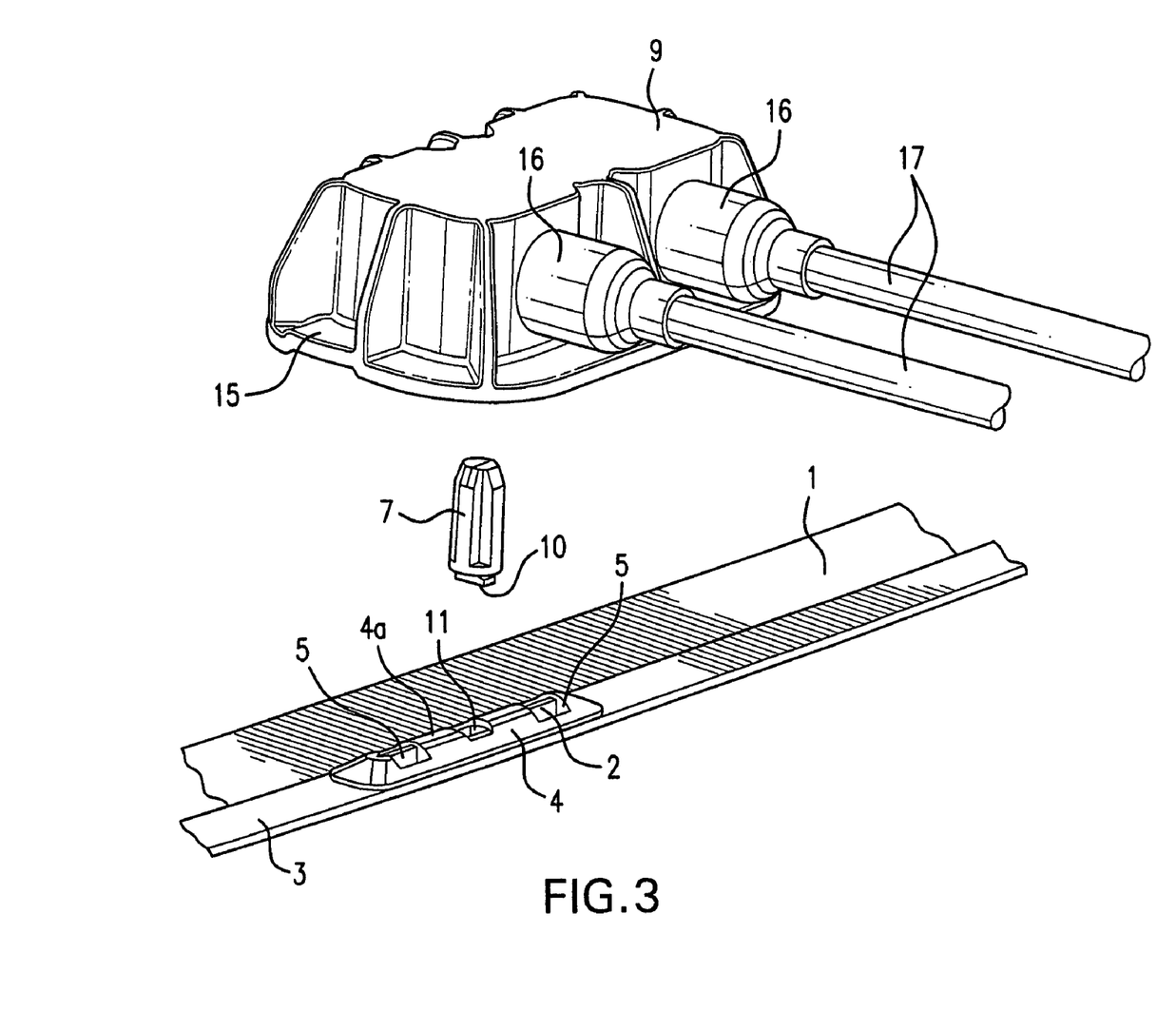
FIG. 3 is a partially exploded perspective view illustrating the manner of connection of the locator pin to the locator member.
Figure 4:
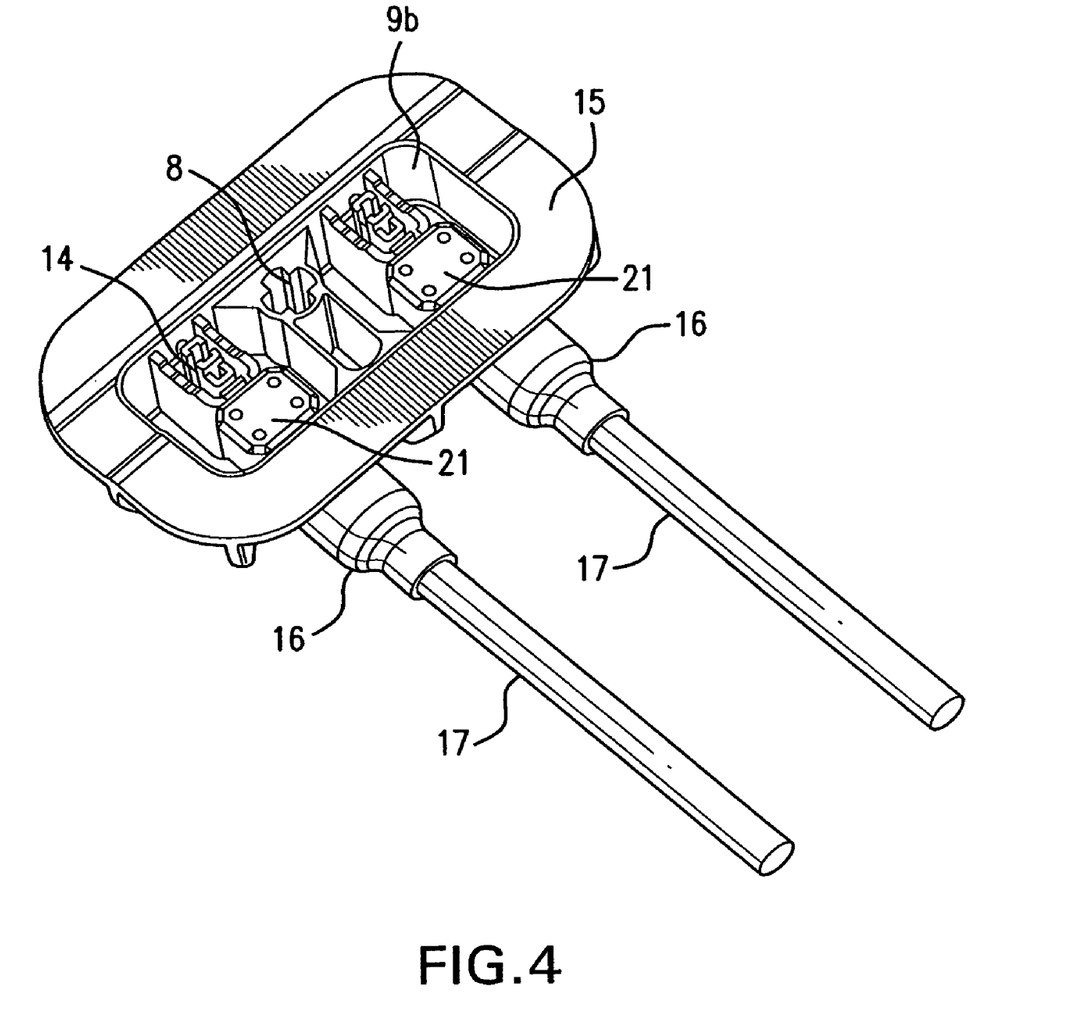
FIG. 4 is a bottom perspective view of the connector housing.
Figure 5:
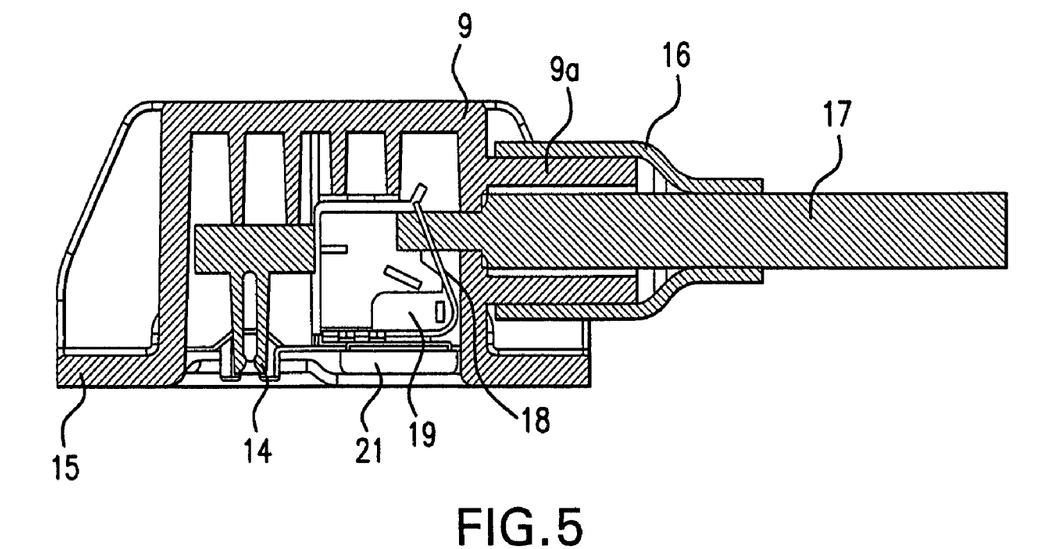
FIG. 5 is a longitudinal sectional view of the connector housing.

As best shown in FIG. 3, extending vertically upwardly from the mounting member 4 is a locator pin 7 having at its lower end a downwardly extending projection 10 with a non-circular cross-sectional profile that extends into a corresponding support opening 11 contained in the top wall 4$a$ of the mounting member 4 between the access openings 5. At its upper end, the locator pin 7 has a non-circular cross-sectional profile and is adapted to extend within a corresponding locator opening 8 (FIG. 4) contained in the bottom of the connector housing 9. The connector housing 9 has an inverted generally dish-shaped configuration containing a chamber 9$b$ in which two resilient contacts 14 are rigidly mounted by means of push-in support members 19 having spring retaining means 18, and support plates 21. Referring to FIG. 5, the bare ends 20 of a pair of insulated conductors 17 extend into the housing chamber 9$a$ for connection with the resilient contacts 14 via protective sleeves 16, and housing inlet openings 9$a$, respectively.

Figure 6:
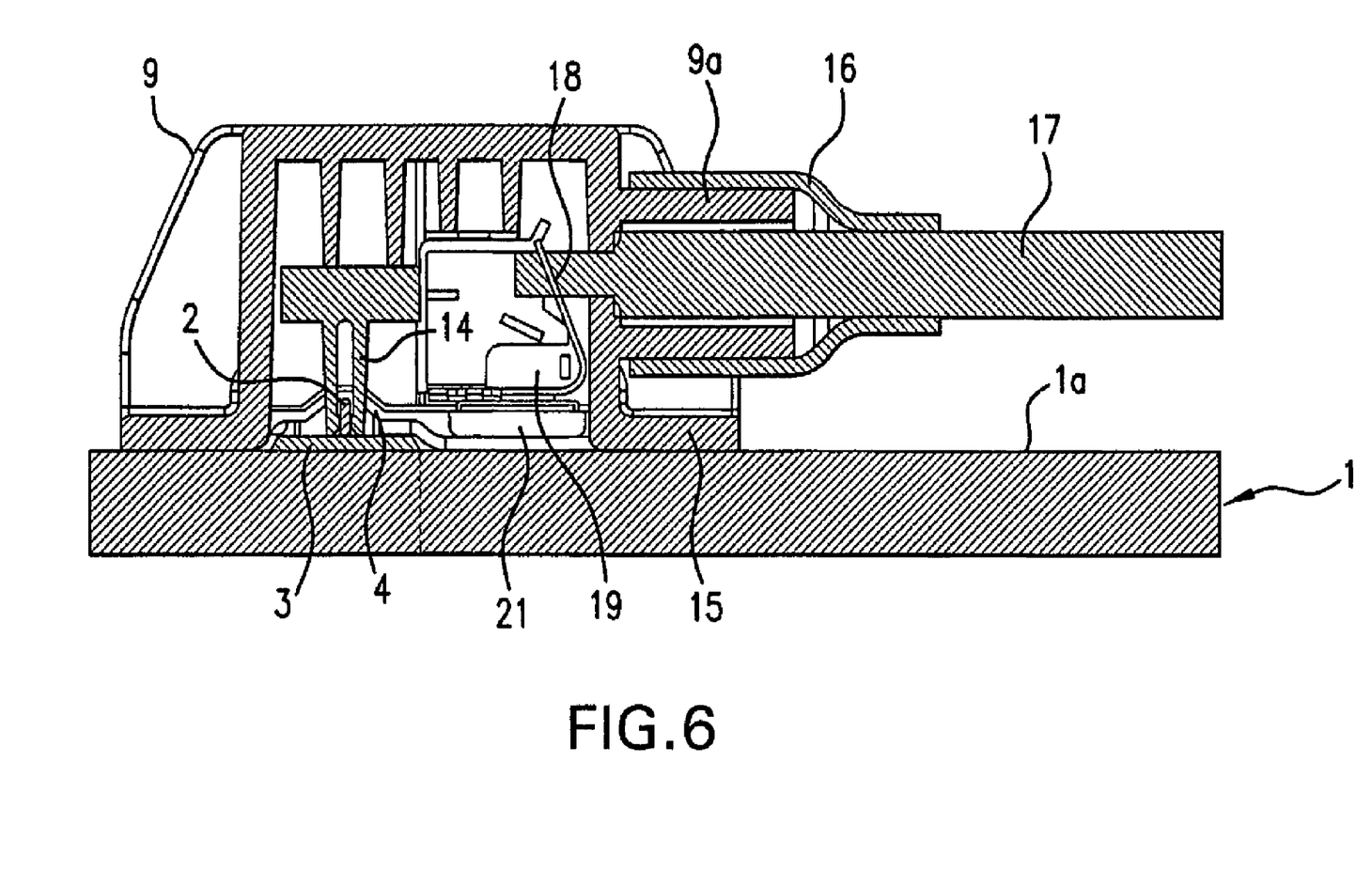
FIG. 6 is a longitudinal sectional view of the connector housing when mounted on the photovoltaic panel.

In order to mount the connector housing 9 (FIG. 5) upon the photovoltaic panel 1 (FIG. 2), the connector housing is displaced until the locator opening 8 is engaged by the tip of the locator pin 7, whereupon the connector housing is progressively displaced downwardly to cause connection between the two resilient connectors 14 and the knife contact 2, as shown in FIG. 6. During this electrical connection of the contacts, the ends of the stationary knife contacts are supported by the slots 6 provided in the walls of the access openings 5.

Figure 7:
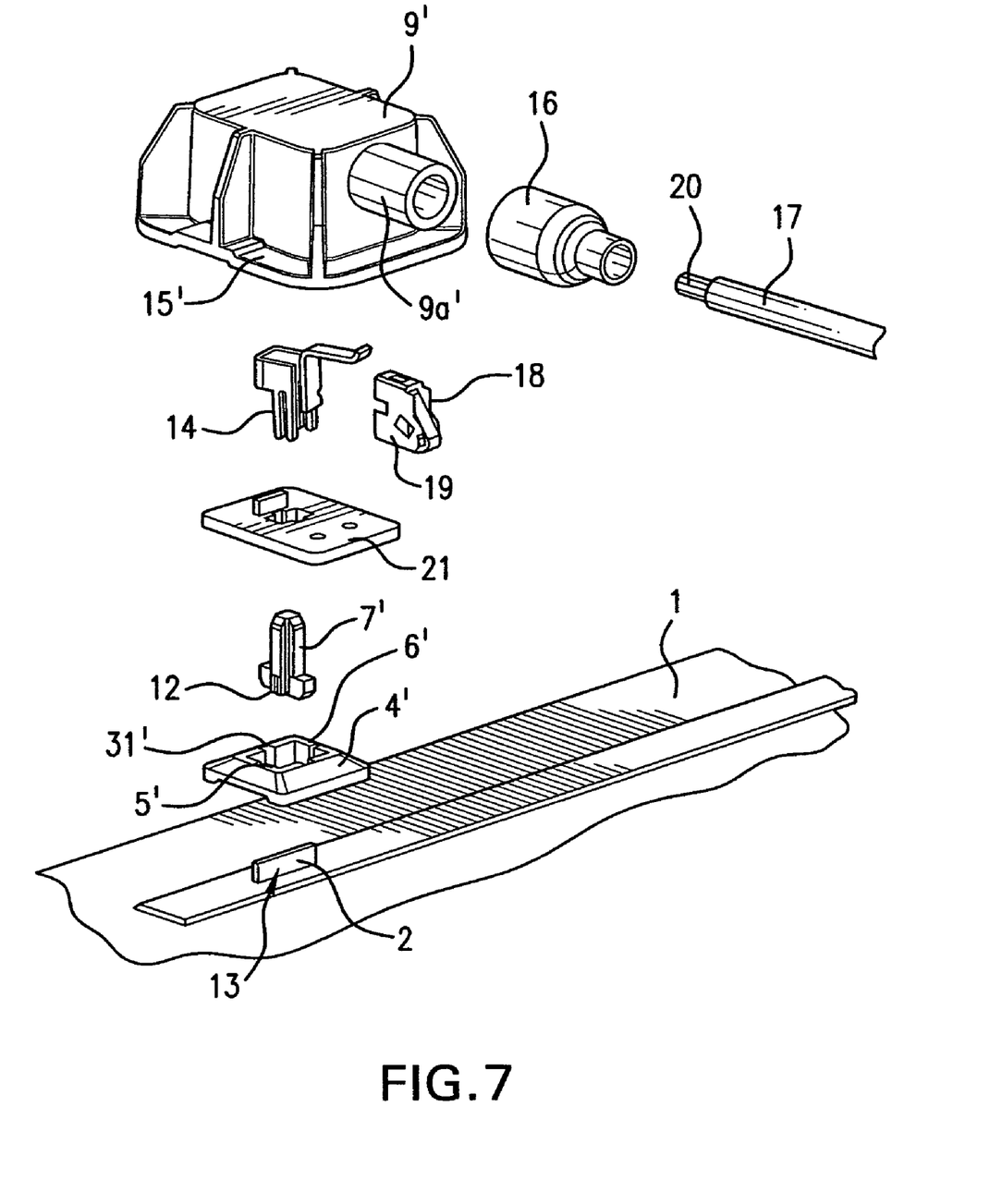
FIG. 7 is an exploded view of a second embodiment of the invention.
Figure 8:
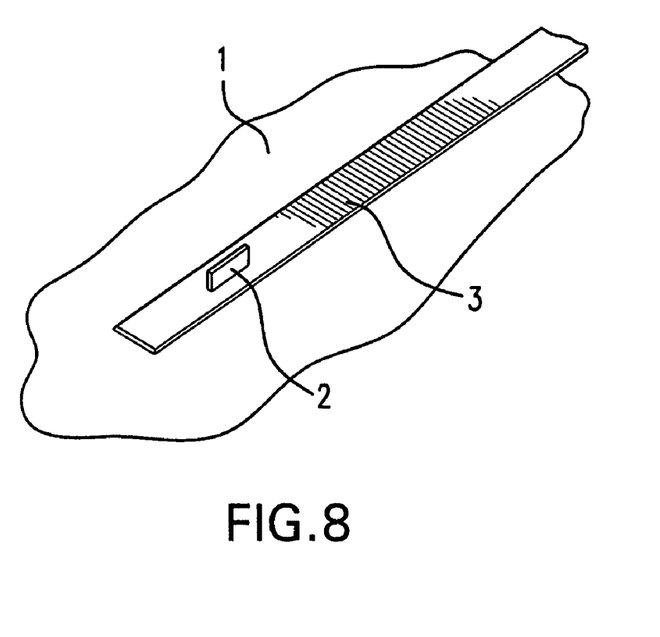
FIGS. 8-11 illustrate the assembly steps for assembling the second embodiment of the invention.
Figure 9:
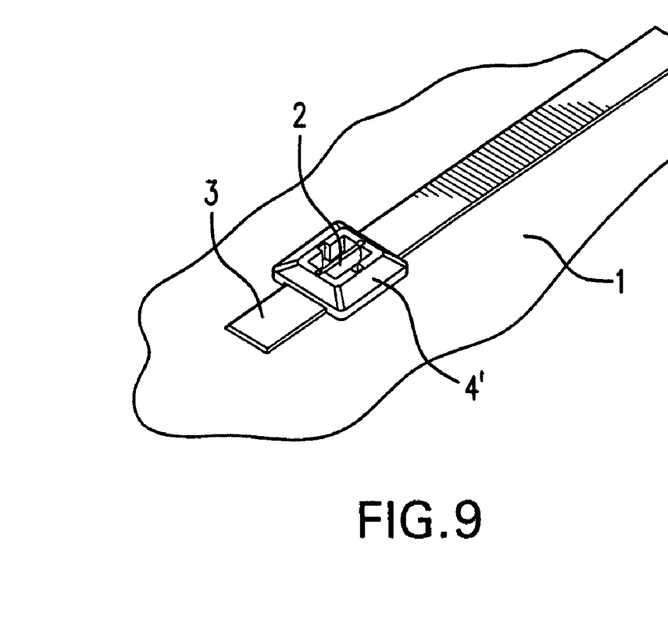
Figure 10:
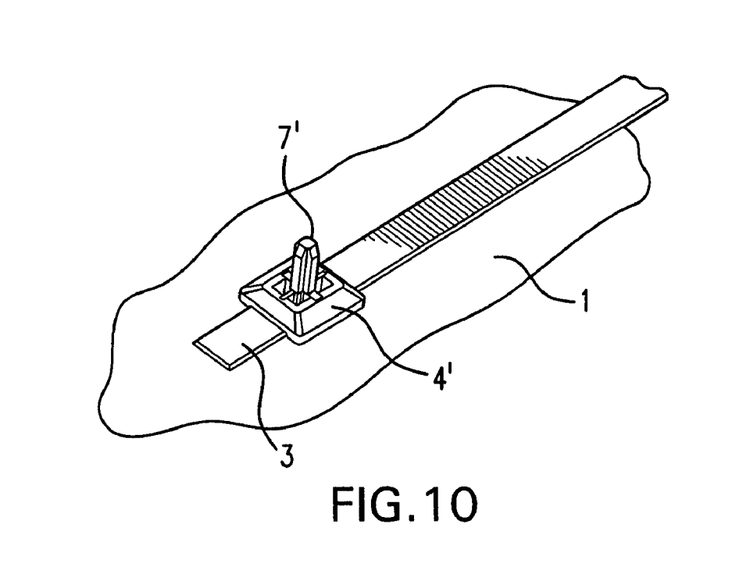
Figure 11:
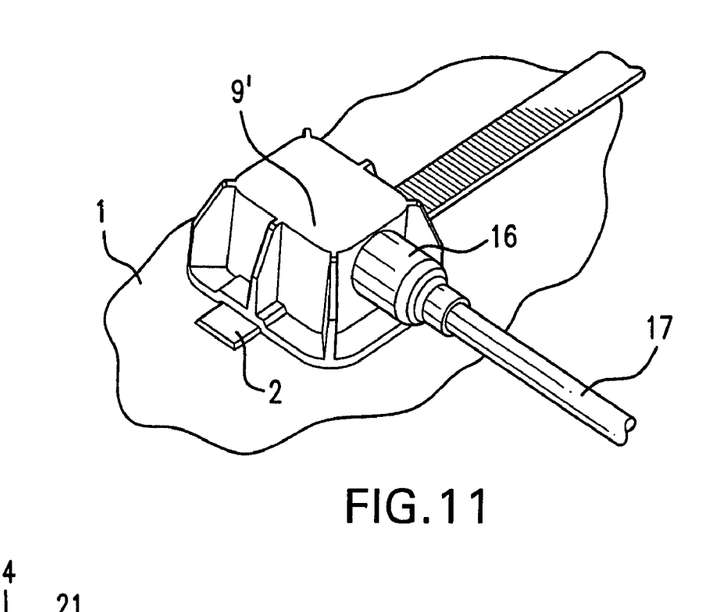

In the second embodiment shown in FIG. 7, a single resilient contact 14 is provided for connection with the stationary knife contact 2. In this case, a single access opening 5' is provided in mounting member 4', which opening serves not only to provide access between the resilient contact 14 and the stationary contact 2, but also to mount the location pin 7' upon the mounting member 4'. To this end, the walls of the access opening 5' contain an opposed first pair of support slots 6' for supporting the ends of the rectangular knife contact 2 (FIG. 9), and an opposed pair of second slots 31 for receiving lateral tab portions 7$a'$ on the locator pin 7' (FIG. 10). A single connector 17 (FIG. 11) is introduced into housing opening 9$a'$ for connection with the stationary contact 2 via the resilient contact 14 retained in the housing 9' by the support member 19 and the support plate 21.

Figure 12:
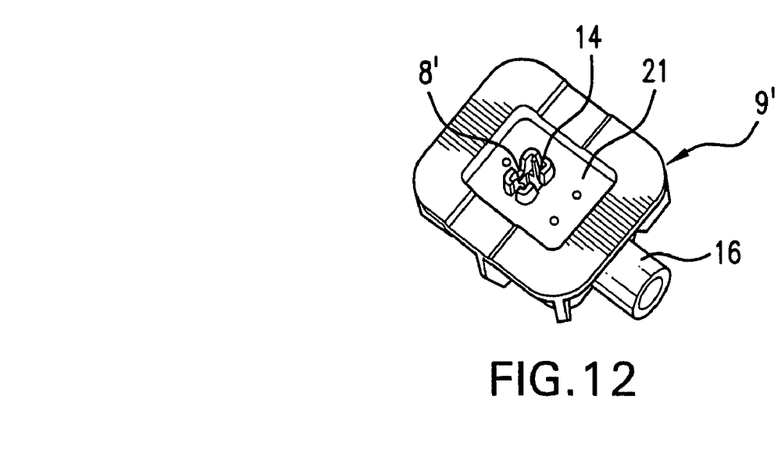
FIG. 12 is a bottom perspective view of the connector housing of FIG. 11.

In this embodiment, the non-circular locator opening 8' in the connector housing for receiving the tip of the locator pin 7' is defined by the space between the arms of the resilient contact 14, as shown in FIG. 12. Furthermore, the bottom extremity of the locating pin 7' may be provided with a stabilizing slit 12 that receives the upper edge of the knife contact 2 to support the same during the engagement thereof by the arms of the resilient contact 14.

The present invention provides the advantage that the components may be preassembled before the connector housing is mounted on the delicate components of the photovoltaic cell, thereby to improve and simplify the assembly of the components. The connector housing may be easily provided with ground connecting means, and with circuit components, such as diodes, resistors, and the like. Furthermore, the connector housing may be use for plus and minus pole connections to the photovoltaic panel 1. The connection to a plurality of stationary contacts on the photovoltaic panel is also possible.

While in accordance with the provisions of the Patent Statutes the preferred forms and embodiments of the invention have been illustrated and described, it will be apparent to those skilled in the art that changes may be made without deviating from the invention described above.

What is claimed is:

1. An electrical connector arrangement for connecting an insulated electrical conductor (17) to the rigid contact (2) of a photovoltaic panel (1), comprising:
   (a) a photovoltaic panel (1) having a horizontal planar upper surface (1$a$);
   (b) a conductive strip (3) mounted on and in electrical engagement with said panel upper surface, said conductive strip having at least one rigid stationary contact (2) extending upwardly from and normal to said conductive strip;
   (c) a connector housing (9) having a bottom wall containing a chamber, said housing including a generally vertical wall portion containing at least one conductor access opening (9$a$) in communication with said chamber;
   (d) at least one resilient contact (14) mounted in said housing chamber, said resilient contact being adapted for electrical connection with one end of a conductor introduced into said chamber via said conductor opening; and
   (e) mounting means for mounting said connector housing on said photovoltaic panel with said resilient contact in electrical engagement with said stationary contact.

2. An electrical connector arrangement as defined in claim 1, wherein said mounting means includes an inverted generally-rectangular dish-shaped mounting member (4) mounted on said conductive strip, said mounting member containing a chamber receiving in spaced relation said stationary contact, said mounting member having a horizontal top surface (4$a$) containing an access opening (5) arranged above said stationary contact and through which said resilient contact extends.

3. An electrical connector arrangement as defined in claim 2, and further including first locator means (7) extending upwardly from said mounting member for cooperation with second locator means (8) associated with said connector housing for positioning said housing at a mounted position relative to said photovoltaic panel in which said resilient contact is in alignment with said stationary contact.

4. An electrical connector arrangement as defined in claim 3, wherein said first locator means comprises a vertical locator pin (7) having a lower end portion provided with a downwardly directed projection (10) that extends within a support opening (11) contained in said mounting member top surface.

5. An electrical connector arrangement as defined in claim 4, where said locator pin has an upper end that extends within a locator opening (8) contained in the bottom of said connector housing, said locator pin and said locator opening having corresponding non-circular cross-sectional configurations.

6. An electrical connector arrangement as defined in claim 4, wherein said stationary contact is a generally rectangular knife contact (2) having a horizontal upper edge; and further wherein the lower extremity of said locator pin projection contains a slot (12) that receives an intermediate portion (13) of said knife contact upper edge.

7. An electrical connector arrangement as defined in claim 4, wherein said connector housing is provided with a pair of said resilient contacts (14) arranged on opposite sides of said locator pin for engagement via a corresponding pair of said access openings with portions of said stationary contact upper edge on opposite sides of said knife contact intermediate portion.

8. An electrical connector arrangement as defined in claim 7, wherein said housing contains a pair of conductor openings (9*a*) communicating with said conductor housing chamber, thereby to afford the entry of the ends of a pair of conductors into said housing chamber for connection with said resilient contacts, respectively.

9. An electrical connector arrangement as defined in claim 2, wherein said stationary contact is a rectangular knife contact having vertical end edges that are supported in a pair of vertical support slots (6) contained in opposed walls of said mounting member access opening.

10. An electrical connector arrangement as defined in claim 2, wherein said housing has at its lower edge a peripheral horizontal flange portion (15) seated on said photovoltaic panel upper surface.

11. An electrical connector arrangement as defined in claim 10, wherein said connector housing has an inverted generally dish-shaped configuration.

12. An electrical connector arrangement as defined in claim 2, wherein said mounting member is adhesively fastened to said conductive strip.

13. An electrical connector arrangement as defined in claim 2, wherein said stationary contact is preformed on said conductive strip prior to the lamination of said conductive strip to said panel upper surface.

14. An electrical connector arrangement as defined in claim 3, wherein said first locator means comprises a locator pin integrally molded with said mounting member, said locator pin extending vertically upwardly from said mounting member; and further wherein said second locator means comprises a locator opening contained in the bottom of said connector housing.

15. An electrical connector arrangement as defined in claim 2, wherein said connector housing and said mounting member are each formed from an electrically insulating synthetic plastic material.

* * * * *